United States Patent [19]

Hawkins

[11] Patent Number: 4,872,088
[45] Date of Patent: Oct. 3, 1989

[54] RADIAL MOUNTING FOR STACKED WAFER MODULES WITH COOLING

[75] Inventor: George W. Hawkins, Mesa, Ariz.

[73] Assignee: Motorola, Inc., Schaumburg, Ill.

[21] Appl. No.: 237,795

[22] Filed: Aug. 29, 1988

[51] Int. Cl.$^4$ .............................................. H05K 7/20
[52] U.S. Cl. .................................. 361/384; 361/395; 361/401; 361/412; 165/80.2; 165/908
[58] Field of Search ................. 361/384, 383, 393–395, 361/401, 410, 412, 414, 413, 415; 174/15.1, 16.1; 165/80.2, 80.3, 908

[56] References Cited

U.S. PATENT DOCUMENTS

| | | | |
|---|---|---|---|
| 3,434,014 | 3/1969 | Taynton | 361/384 |
| 3,808,506 | 4/1974 | Lang | 361/394 |
| 4,539,622 | 9/1985 | Akasaki | 361/401 |
| 4,590,538 | 5/1986 | Cray, Jr. | 361/385 |
| 4,674,004 | 6/1987 | Smith et al. | 361/384 |
| 4,682,414 | 7/1987 | Butt | 29/840 |

Primary Examiner—A. D. Pellinen
Assistant Examiner—David Osborn
Attorney, Agent, or Firm—Joe E. Barbee

[57] ABSTRACT

A modular packaging structure consisting of a plurality of modules, each capable of performing different functions, coupled to a central core. The modules are comprised of a pair of half semiconductor wafers bonded together. Each wafer contains a plurality of semiconductor devices inset in the wafer and having interconnect lines connecting the devices to the wafer. The module has a plurality of contacts along the straight edge to allow coupling. The straight edge of the module is inserted into a core of the modular computer. The core acts as a power and signal bus to the modules and serves to clamp the modules in place. A slot in the core is left for the external electrical connections. A cooling manifold can be disposed about the modules to provide air cooling. The structure is then placed in a housing having a fan to pump air through the cooling manifold.

17 Claims, 8 Drawing Sheets

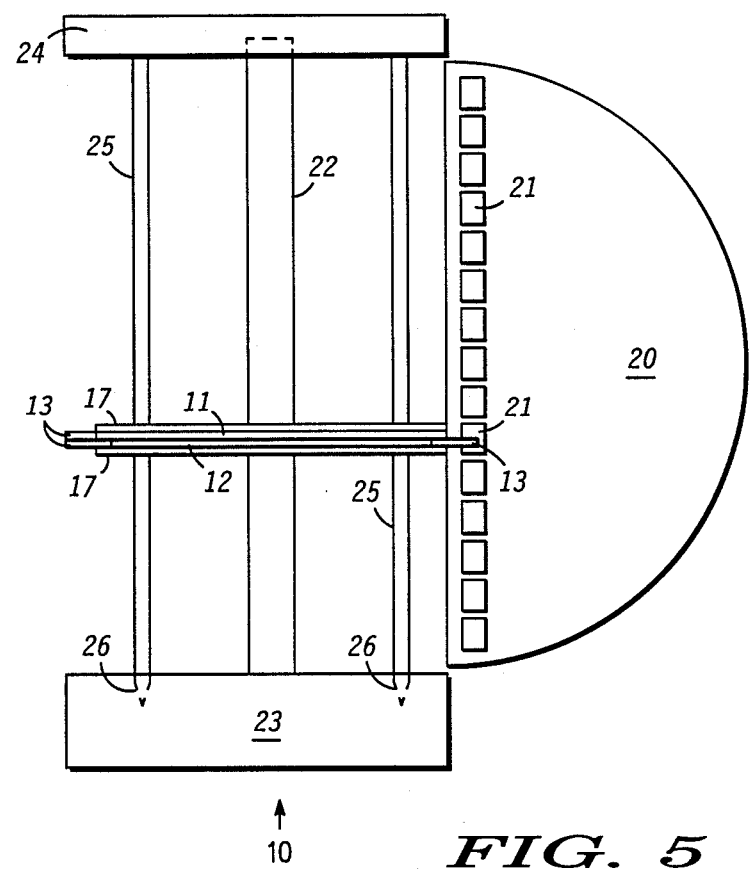
FIG. 5
FIG. 6
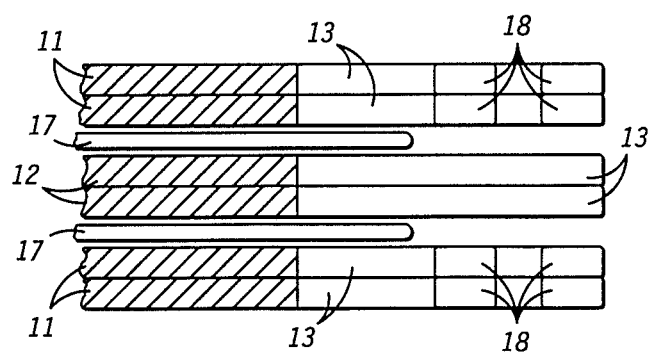

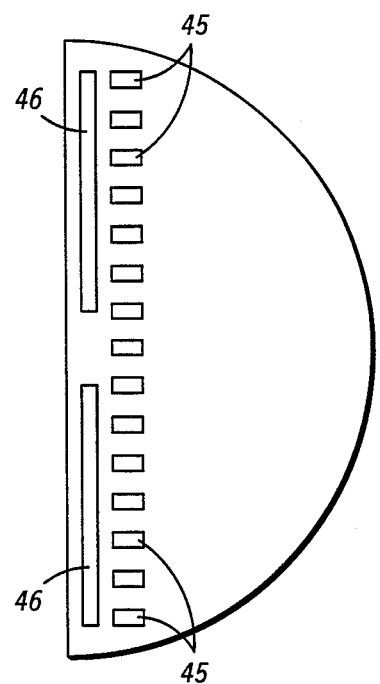
FIG. 10
FIG. 16
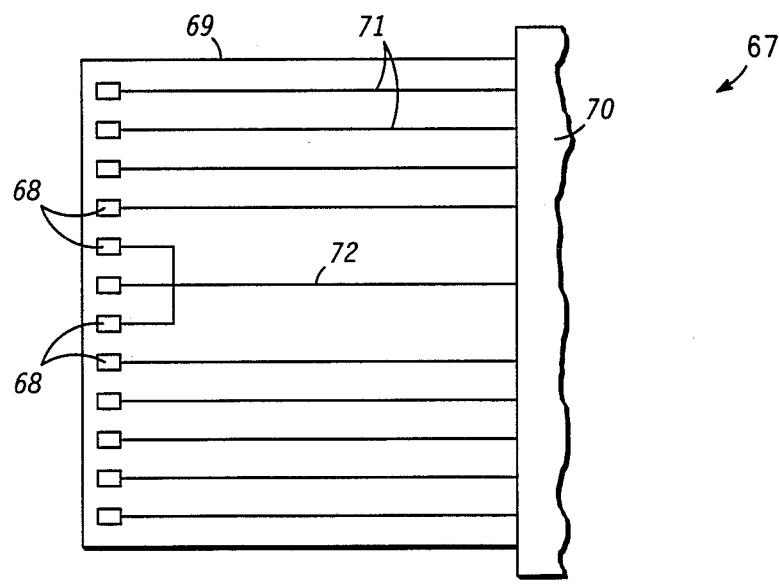

RADIAL MOUNTING FOR STACKED WAFER MODULES WITH COOLING

BACKGROUND OF THE INVENTION

The present invention relates, in general, to a packaging structure and, more particularly, to a modular packaging structure for a computer or the like.

There are many differing types of computers and computer systems known in the art. However, there is a continuing effort to reduce the size and increase the flexibility of computers. One such system is illustrated in U.S. Pat. 4,734,825 entitled "Integrated Circuit Stackable Package" which issued to William M. Peterson on Mar. 29, 1988.

Accordingly, it is an object of the present invention to provide a modular packaging structure for electronic systems.

A further subject of the present invention is to provide a modular structure for a computer or the like which is compact.

Another object of the present invention is to provide a modular packaging structure for an electronic system that is flexible in construction.

Still another object of the present invention is to provide a modular packaging structure which utilizes silicon module construction.

Yet another object of the present invention is to provide a modular packaging structure with short communication lines for faster communications.

Another object of the present invention is to provide a modular packaging structure which provides a large surface area for cooling.

Still another object of the present invention is to provide a modular packaging structure for an electronic system having a core to which various modules may be coupled.

SUMMARY OF THE INVENTION

A particular embodiment of the present invention consists of a plurality of modules, each capable of performing different functions. The modules are comprised of a pair of half semiconductor wafers bonded together to form a semicircle. Each wafer contains various semiconductor devices inset in the wafer and having signal lines interconnecting the devices on the wafer. The module has a plurality of contacts along the straight edge of the semicircle to allow electrical coupling. The straight edge of the module is inserted into a core of the modular packaging system. The core acts as a signal bus to the various modules and serves to clamp the modules in place. One slot in the core is left for the external connections (signals lines, power, ground, etc.). A cooling manifold is then disposed about the modules to provide cooling. The device is then placed in a housing having a fan to pump a cooling fluid through the cooling manifold.

BRIEF DESCRIPTION OF THE DRAWINGS

FIG. 5 is a side view of a portion of an embodiment of the present invention;

FIG. 6 is a partial cross sectional view of a second set of contact rings for use by an embodiment of the present invention;

FIG. 10 is a side view of a module for use with the second connector/core of FIGS 6-8;

FIGS. 16 is a side view of an external I/0 board for use with a modular packaging structure embodying the present invention;

DETAILED DESCRIPTION OF THE DRAWINGS

Figure 1:
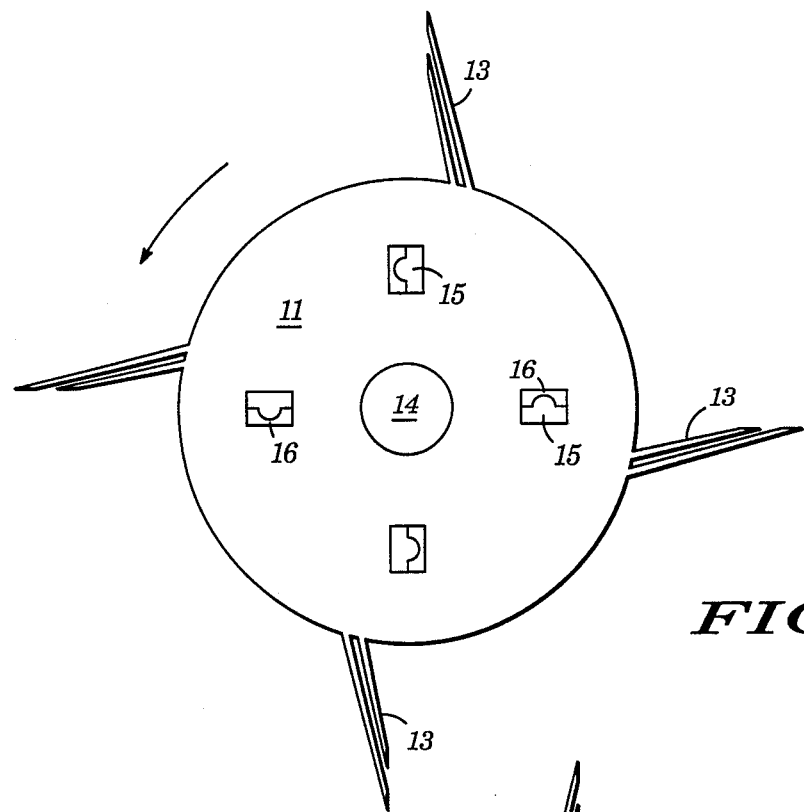
FIGS. 1 and 2 are top views of left-hand and right-hand contact rings for use by a modular packaging structure embodying the present invention.
Figure 2:
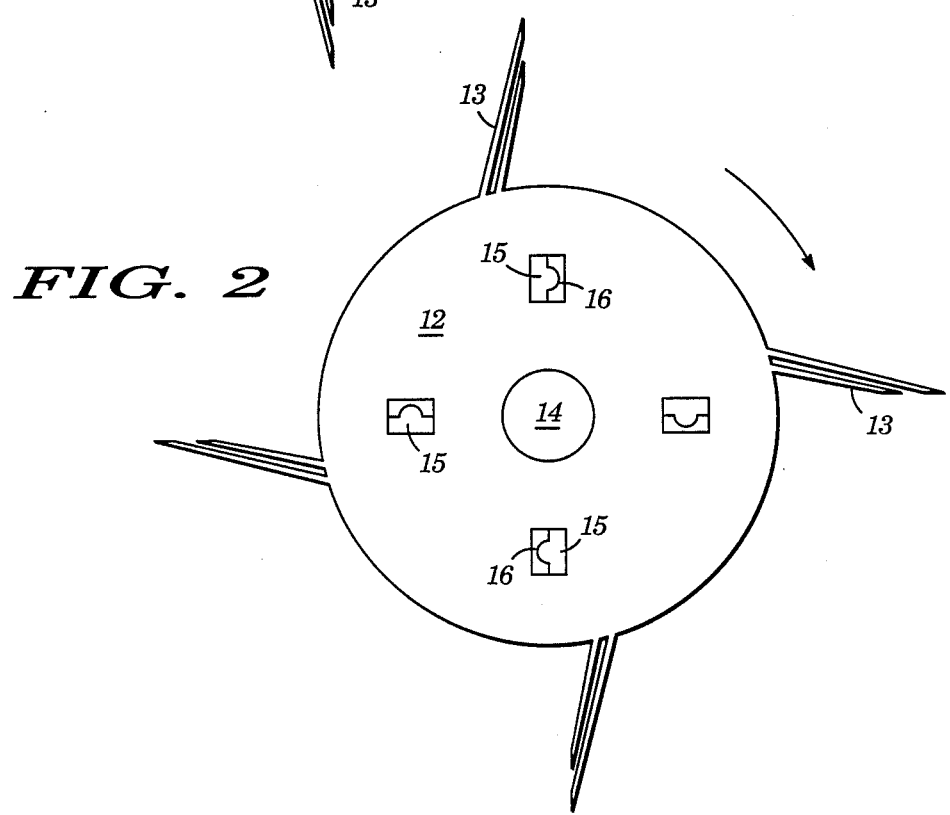

Referring initially to FIGS. 1 and 2, left-hand and right-hand contact rings, generally designated 11 and 12, respectively, are illustrated. Contact rings 11 and 12 are circular in shape and have a plurality of contact arms 13 extending from the periphery. The number of contact arms on each contact ring will depend upon the number of interconnections required. A shaft opening 14 is disposed in the center of rings 11 and 12. Opening 14 is provided to permit stacking of rings 11 and 12 on a central shaft. Rings 11 and 12 also contain locking openings 15 having an insulating strip which has a notch 16. The insulating strip occupies almost half of opening 15. When operated in unison, a bar inserted in notch 16 will move ring 11 counter clockwise and ring 12 clockwise. This will move a pair of arms 13 of each ring 11 and 12 toward each other. The insulating strip having notch 16 is a long strip which is inserted into opening 15 and passes through all the rings in a stack.

Figure 3:
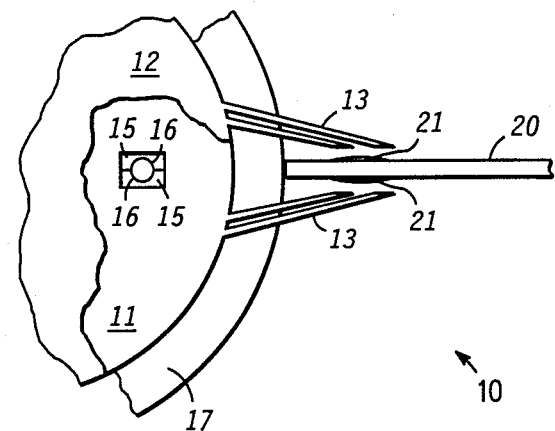
FIGS. 4 and 3 are top views of a portion of the contact rings of FIGS. 1 and 2 in operation.
Figure 4:
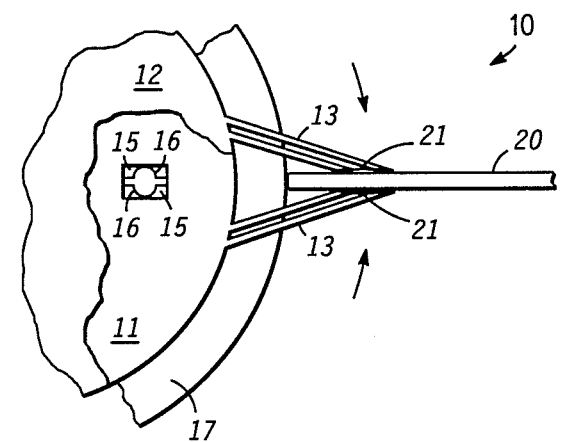

The operation of rings 11 and 12 is illustrated in FIGS. 3 and 4. FIG. 3 shows a portion of a modular packaging structure 10 having ring 11 disposed on ring 12 which in turn is disposed on an insulating ring 17. A portion of illustrated contact ring 11 is shown cut away to better illustrate contact ring 12 and its contact arm 13. A module 20 having contacts 21 is then inserted between contacts 13 of rings 11 and 12. Openings 15 will be lined up as illustrated in FIG. 3 with notches 16 forming an opening extending thru rings 11 and 12. In operation, a rod, not shown, is inserted thru the opening formed by notches 16. The rod is tapered in width at the leading end such that as it is inserted, rings 11 and 12 will be rotated about the central shaft. The rod passes along notches 16 in the insulating strip. The insulating strips serve to insulate the rod from rings 11, 12. In addition, the insulating strips prevent wear on the edges of rings 11, 12 and keep rings 11, 12 from rotating too far. In a preferred embodiment, a similar arrangement is used to open arms 13; by starting with a separate set of openings having an opposite phase or opposite facing notches 16.

As shown in FIG. 4, opening 15 thru rings 11 and 12 has been aligned and expanded causing rings 11 and 12 to rotate to a point where arms 13 have contacted module contacts 21. By having two contact arms 13 on each side of module 20, redundant contact is provided.

A side view of the device in FIG. 4 assembled on an insulated core shaft is illustrated in FIG. 5. Rings 11 and 12 are stacked on insulated shaft 22 between a pair of insulators 17. Insulators 17 serve two functions: first, they act to electrically separate sets of left and right contact rings 11 and 12; and second, they act as a spacer to position module 20 in the proper location. In addition, by varying the size of insulators 17 and placing notches in modules 20, a key locator can be formed. This can be used to prevent the placement of module 20 in a slot it should not occupy. Module 20 is shown having a plurality of contacts 21 disposed along the straight edge where contact arms 13 make electrical contact. In an actual system or subsystem, additional sets of contact rings would be provided as required and stacked on shaft 22. Also modules 20 would be radially disposed over the entire circumference of shaft 22, except for space left for an input/output board.

Each contact ring 11, 12 has a number of arms 13 that make electrical contact with contacts 21 on modules 20. Alternate rings 11, 12 have arms 13 that are angled clockwise and counterclockwise, respectively, to mate with contacts on opposite sides of module 20. To provide reliable contacts, arms 13 are flexible to provide constant contact force. Arms 13 are in pairs to make two contacts with each arm 13. Contact rings 11, 12 are made of two sheets of metal to double the number of contacts again, and to make etching of contact rings 11, 12 more accurate. Using many closely spaced and flexible contacts also provides uniform support of modules 20 with little bending stress on the silicon (of module 20). Stress analysis of the pairs of arms 13 indicate that arms 13 should be almost but not quite parallel. When arms 13 are non-parallel, the radius of the base of arms 13 can be enlarged to reduce the stress concentration.

Shaft 22 is supported by a bottom cap 23 which also serves to support the plurality of contact rings 11 and 12 and insulator rings 17. A top cap 24 is also provided with at least one locking rod 25. Locking rods 25 are tapered at the end which contacts bottom cap 23 such that a point 26 of locking rods 25 will be inserted in the opening 15 through rings 11 and 12 and aligned by notches 16. As rods 25 are inserted further, rings 11 and 12 are rotated until the full thickness of rod 25 has been reached. At this point, arms 13 will be in contact with module contacts 21. Rods 25 are further inserted until point 26 is disposed in bottom cap 23 and shaft 22 is disposed in top cap 24. Shaft 22 along with contact rings 11, 12 and insulators 17 serve as a central core means.

Making the core connector means out of metal and with no flexible insulation, permits the use of the core at cryogenic temperatures which results in large current capability in a small space. Also use of the present core means results in almost identical electrical connections to each module, which helps high speed communication.

A partial cross sectional view of a second set of contact rings for use by a modular packaging structure embodying the present invention is illustrated in FIG. 6. A pair of contact rings 11 is shown stacked on an insulator 17. Below insulator 17 is a pair of contact rings 12, another insulator 17, and another pair of rings 11. This double stacking of rings 11 and 12 is utilized to give added reliability to the rings. Rings 11 ad 12 are processed by etching to obtain the fine detail required. Consequently, the thickness of the rings is limited by the etching process. Each contact arm 13 has a pair of contact pads 18. This provides four pads 18 to contact a single module contact 21. By providing four pads in this fashion, some redundancy is build into the system and some compensation is provided for tolerances in the placement of module contacts 21 and rings 11 and 12.

A complete modular structure (a portion of which is shown in FIG. 5) reduces the physical size and cost of the resulting system or subsystem by using new structural ideas and assembly techniques. This invention incorporates the use of extra silicon rather than external components or peripherals. The actual architecture of the system is not constrained, except for the division of the system into modules 20 connected by a bus (core means), and it is likely that each end user would have module designs to accommodate a specific architecture and operating systems. The system could be a computer, signal processor, data acquisition system, telephone switching system or anything that uses a lot of integrated circuit chips. The small size of the package means the interconnection links between chips are shorter and have less capacitance. Thus the chips can operate at higher clock rates, lower error rates, and use less powerful drives on the output lines for lower heat dissipation.

Figure 7:
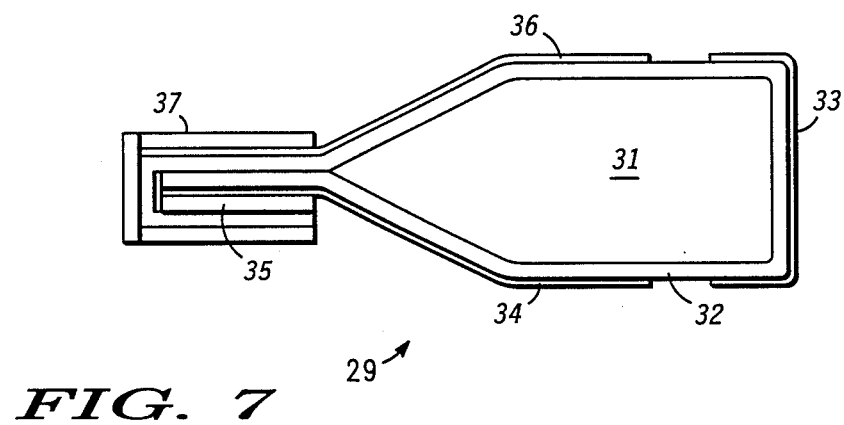
FIGS. 7 and 8 are top and perspective views of a connector of a second connector core for a modular packaging structure embodying the present invention.
Figure 8:
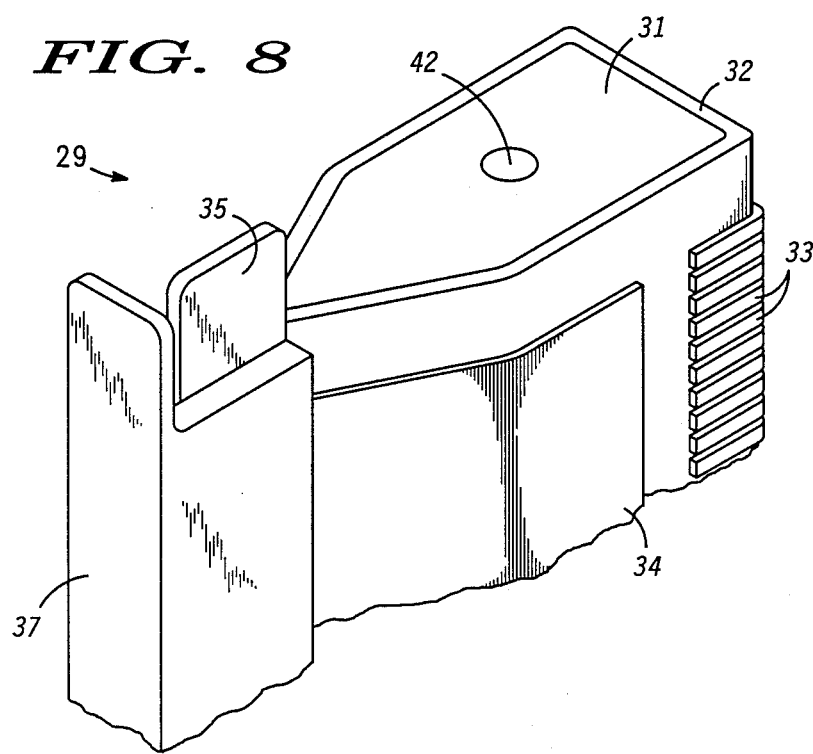
Figure 9:
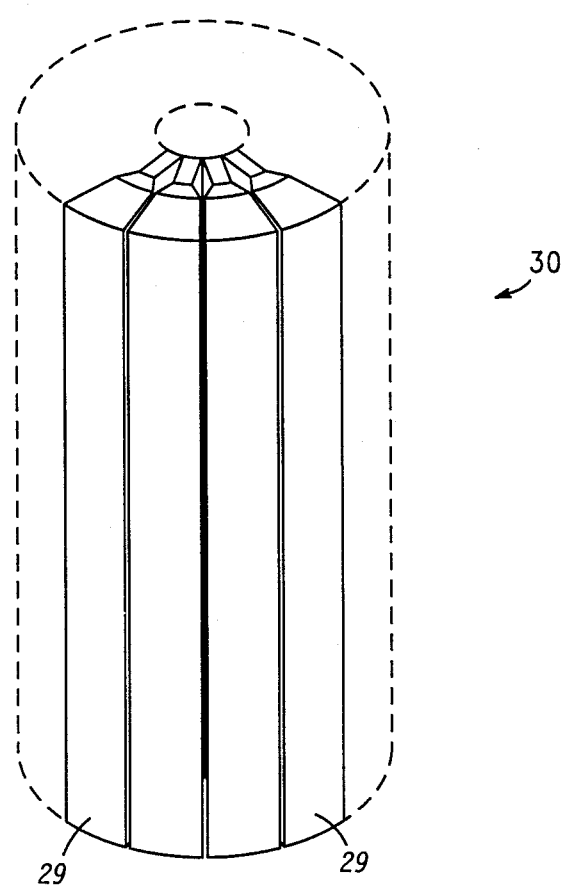
FIG. 9 is a perspective view of the second connector core and its base.
Figure 9:
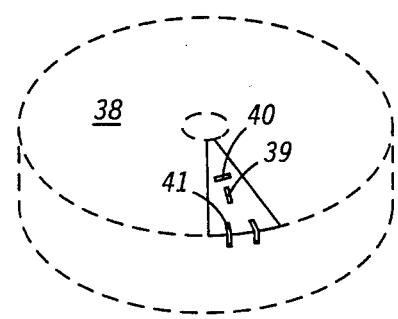

Referring now to an alternate contact arrangement illustrated in cross-section in FIGS. 7-9; a connector 29 consists of a foam spring type center 31. Foam spring elastomeric connectors are made by PCK Elastomerics, Inc. of 2940 Turnpike Drive, Hatboro, PA. About center 31 is disposed an elastomer connector strip 32. Elastomer connector strip 32 supplies: a plurality of signal contacts 33, a power contact 34, and a ground contact 36, for coupling to the modules. Power contact 34 is coupled to a power bar 35. Ground contact 36 is coupled to a ground bar 37. As shown in FIG. 8, power bar 35 and ground bar 37 each have a tab extending out one end of connector 29. FIG. 9 illustrates a base 38 which is designed to receive a plurality of connectors 29. Base 38 has a plurality of power connector receptacles 39 and ground connector receptacles 40. The tabs of power bar 35 and ground bar 37 are inserted into connector receptacles 39 and 40, respectively. A pair of alignment notches 41 are provided to align connectors 29 as they are inserted in base 38.

In the assembled state, connector core 30 will have a plurality of connectors 29 disposed side-by-side. These are designed such that the signal lines of one connector 29 will contact the connector lines of each adjacent connector 29. This provides a bus about core 30 for each signal line 33. A module 44, FIG. 10, may then be inserted between a pair of connectors 29. Module 44 consists of a plurality of signal contacts 45 and a power contact 46. It should be noted here that, if different power levels are required for the various devices in module 44, more than one power contact 46 can be provided. Access to additional power contacts 46 can be achieved by having additional power bars within connector 29. The additional power can be supplied either through the bottom with the other power; or through the opposite end of connector 29.

To insert module 44 between a pair of connectors 29, a vacuum is applied to a suction port 42 (illustrated in FIG. 8) located in foam spring center 31. A suction applied to this port causes foam center 31 to contract providing a space between adjacent connectors 29. Module 44 is then inserted between connectors 29 and the suction removed. Foam center 31 then springs back into place, holding module 44 secure and making electrical contact between module 44 and connector 29.

Figure 11:
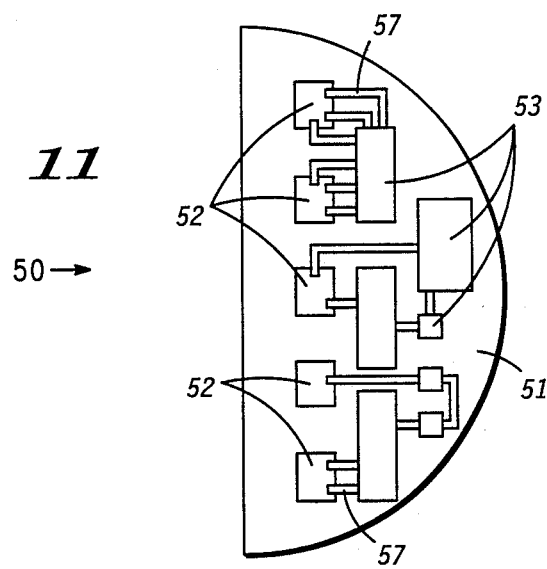
FIG. 11-15 are various views of a module used in a modular packaging structure embodying the present invention.

Referring now to FIGS. 11-15 a module, generally designated 50, is illustrated. Module 50 consists of two wafer halves 51, a front side of which is shown in FIG. 11. Each wafer half 51 has a plurality of pass through chips 52 and device chips 53 disposed therein. Device chips 53 can be, but are not limited to, semiconductor integrated circuit devices such as: MPU, memories, application specific devices (ASIC), logic circuits, etc. Examples of methods for inserting devices 53 into wafers 51 can be found in copending patent applications "Coplanar Die to Substrate Bond Method" having Ser. No. 025,687, invented by Drye, et al. and assigned to Motorola Inc. and "Coplanar Die to Substrate Bond Method" having Ser. No 056,497, invented by Reed, et al. and assigned to Motorola Inc.

A plurality of interconnect lines 57 serve to interconnect chips 52 and devices 53. Examples of forming interconnect lines 57 can be found in allowed patent application Ser. No 077,476 entitled "Multilevel Interconnect Transfer Process" invented by Thomas E. Wood and assigned to Motorola Inc.

Figure 13:
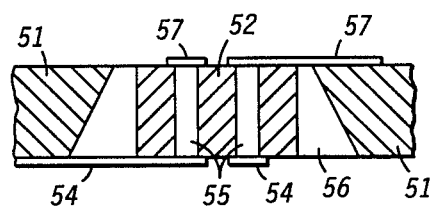
Figure 12:
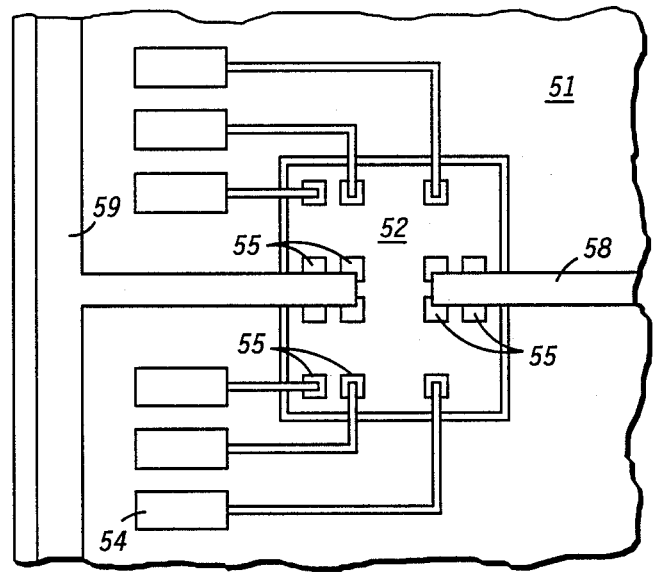

Pass through chips 52 are shown in more detail in FIGS. 12 and 13. FIG 12 shows a plan view of chip 52 inserted in wafer 51 and held in place by an adhesive 56 seen in FIG. 13. Adhesive 56 can be any suitable sealing glass, epoxy adhesive, or the like. A plurality of signal contacts 54 are each coupled to a pass through contact 55 which passes the signal through to the surface of module 50 illustrated in FIG. 11. A power contact 59 is shown coupled to a plurality of pass through contacts 55. Since a single contact 55 is not large enough to handle the power requirements and because processing techniques place limits on the size of contacts 55, several contacts 55 must be used. A backside contact 58 is also illustrated. Backside contact 58 is provided for devices which require electrical contact to the backside of device 53.

A cross sectional view of a pass through chip 52 is illustrated in FIG. 13. Pass through chip 52 is inserted in an opening of wafer 51 and secured in place by adhesive 56. Chip 52 has contacts 55 extending from one surface through to the other. In operation, a signal is transmitted along signal contact 54, through contact 55, to interconnects 57. It should be noted that signals can also travel in the reverse direction.

Figure 14:
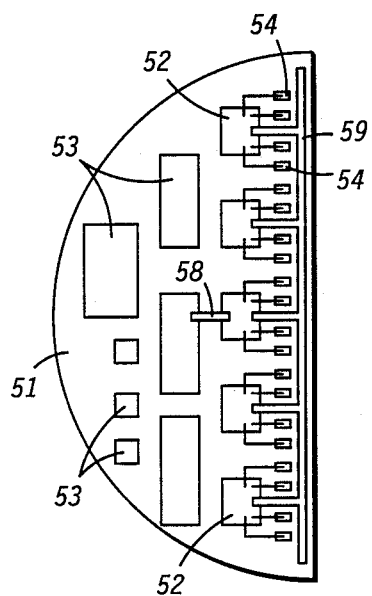

In FIG. 14, the backside of wafer 51 is illustrated. Here a plurality of signal contacts 54 are shown with a power contact 59. These are coupled to pass through chips 52. Interconnect lines 58 provide the connection to devices 53.

Figure 15:
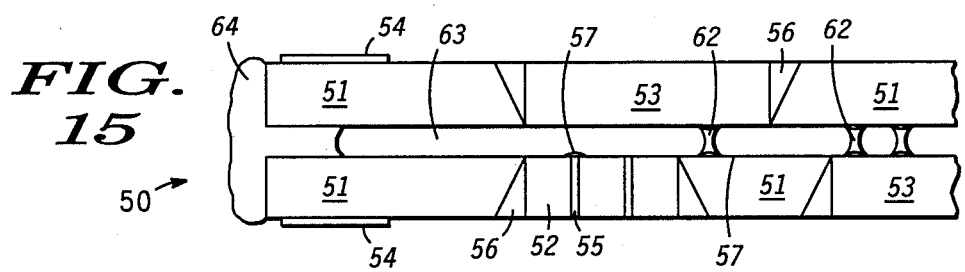

Referring now to FIG. 15, a partial cross sectional view of module 50 is illustrated. As stated previously, module 50 consists of a pair of half wafers 51. Each wafer 51 having pass through chips 52 and devices 53 disposed therein. Wafers 51 are coupled together by what is commonly referred to in the industry as flip-chip technology. This allows interconnects to pass between wafers 51 at interconnect points 62. As shown in FIG. 15, a space 63 is left between wafers 51. This serves a dual purpose. First, the gap allows the overall thickness of module 50 to be maintained. Since wafers 51 may vary in thickness, this can be compensated when module 50 is formed. This constant thickness is needed to ensure proper connection with the core contacts. The second purpose of space 63 is related to the flip-chip coupling. It has been found that flip-chip coupling is more efficient, e.g. less stressful, if a minimum height is maintained.

Interconnecting wafers 51 by solder dots on their metallization patterns allows the use of both sets of metallization layers for routing and allows access to both sides of an input/output connector. The solder dots also fasten both wafers 51 mechanically and increase the strength of module 50. In this case the solder dots will not suffer the usual fatigue problems of solder dots in flip-chip construction because the dots connect two silicon parts at roughly the same temperature and thus will have little shear fatigue.

A glass seal 64 is used to seal about the circumference of module 50. Preferably, seal 64 would be disposed about module 50 while module 50 is in a vacuum or inert gas (such as helium) environment. This provides a hermetic seal for module 50 and a noncorrosive environment for devices 53.

Once modules 50 are completed and inserted into a core, an input/output (I/0) board, such as board 67 in FIG. 16 is required. Board 67 is designed to fit into the core of modular packaging structure 10 in the same manner as a module. A surface 69 of board 67 has a plurality of contacts 68 which will be coupled to the core. Board 67 also comprises a connector 70 disposed at the opposite end of board 67 with a plurality of signal lines 71 running between contacts 68 and connector 70. In addition, a power line 72 is illustrated extending from connector 70 to a plurality of contacts 68. This may be required to provide the surface area necessary to transmit the power required. For a higher power capacity, one set of rings (the right-handed set, for example) can be made with one set of arms 13 replaced by a solid strip which makes contact to power board 67 by welding, soldering, or the like. The left-handed set of rings then must do all of the rotating to open and close arms 13. It should be noted that the other surface of board 67 also contains contacts and signal lines.

Figure 17:
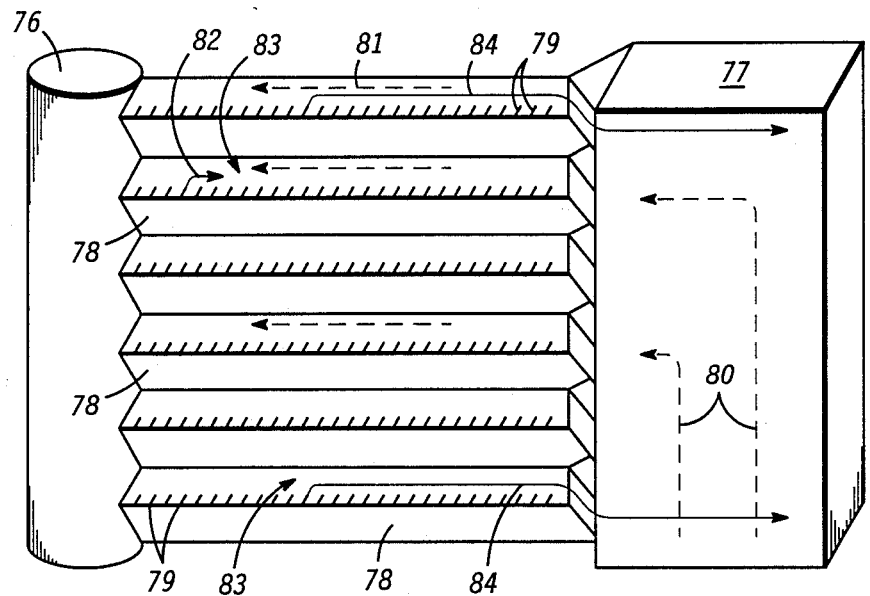
FIG. 17--are views of a cooling manifold for use with a modular packaging structure embodying the present invention.
Figure 18:
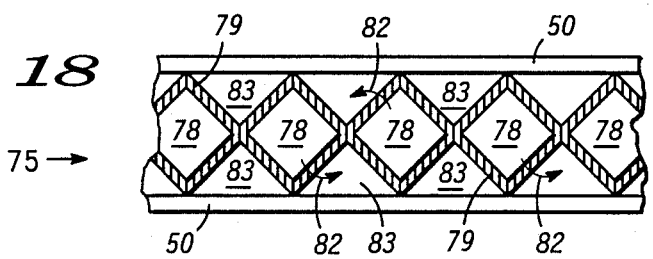
Figure 19:
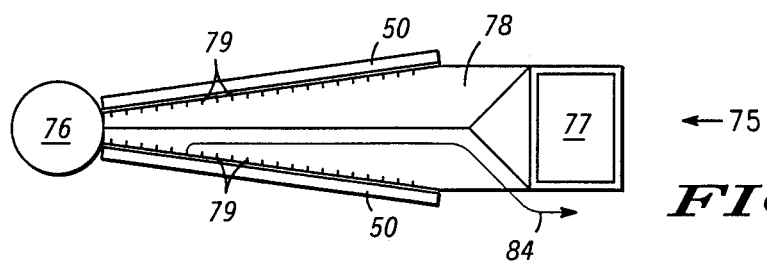

With modular packaging structure 10 having a large number of active devices, keeping the devices cooled becomes a concern. To cool modular structure 10 described above, a cooling manifold, generally designated 75, is utilized. A portion of manifold 75 is illustrated in FIGS 17-19. Manifold 75 is inserted in a wedge shaped gap formed by a pair of modules 50 and is adjacent a core 76. Manifold 75 consists of a main duct 77 and a plurality of inlet ducts 78. Each inlet duct 78 has a plurality of jets, or small openings, 79.

In operation, cool fluid such as air, liquid nitrogen or the like is forced up main duct 77 as shown by dashed arrows 80. The cool fluid stream then passes through inlet ducts 78 toward core 76, as represented by dashed arrows 81. The cool fluid stream is then forced out jets 79, as shown by solid arrows 82, where the cool fluid is directed onto the back side of a wafer 51 of modules 50. The exhaust fluid is then removed from structure 10 along an outlet opening 83 formed by inlet ducts 78 and modules 50 as illustrated by arrow 84. The exhaust fluid is then vented or exhausted from structure 10.

The fluid flow over the backside of module 50 travels a very short distance at very high velocities. This results in a good heat transfer coefficient. The location and size of jets 79 can be varied to compensate for exceptional heat requirements of individual devices 53. Manifold 75 provides the needed cooling without the use of bulky heat sinks. Manifold 75 also serves to give added mechanical support to modules 50. It should be noted that structure 10 could also be cooled using a fluid, with or without manifold 75.

Manifold 75 is made of a material resistant to the temperatures expected to be encountered in structure 10. Preferably, manifold 75 would be an electrically conductive material coated by an electrically insulating layer. This can then be used to provide an RF ground between modules 50 as well as serving as a heat sink for structure 10. The wedge shape of manifold 75 allows them to provide mechanical support to modules 50 when manifolds 75 are pushed tightly into the intermodule gap. This makes the assembly or structure resistant to impact or vibration. Manifolds 75 must be soft and springy enough to avoid stressing modules 50.

Figure 20:
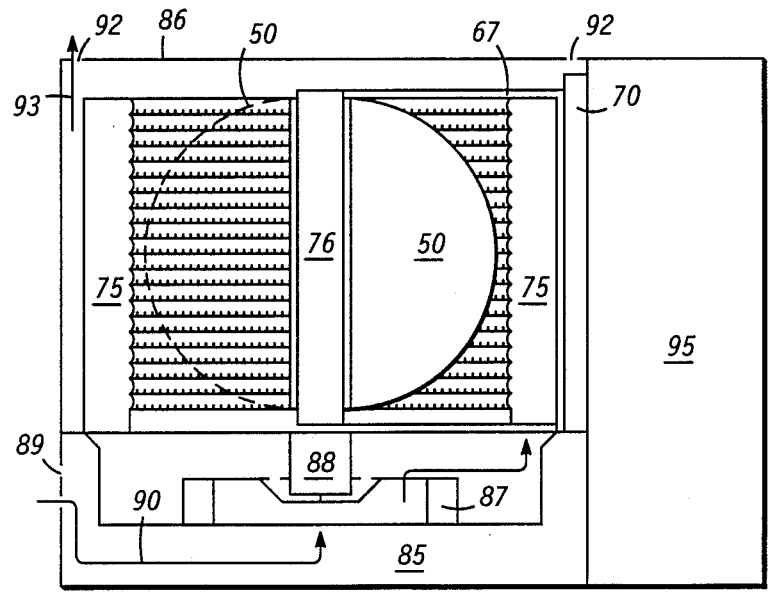
FIG. 20 illustrates a modular packaging structure, with portions broken away, embodying the present invention.

An assembled modular structure 10 is illustrated in FIG. 20. A housing 86 is disposed about packaging structure 10. The lower portion of housing 86 is illustrated as containing a fan 87 driven by a motor 88. Fan 87 acts to draw air into a plenum 85 through inlet ports 89, as illustrated by arrow 90. If desired, a filter can be placed about inlet port 89. The air flow then passes through fan 87 and is forced into manifold 75, as illustrated by arrow 91. The air stream then passes through manifold 75, along modules 50, and into housing 86. The heated air is then exhausted out through an exhaust port 92, as illustrated by arrow 93.

Coupled to the side of housing 86 is an external connector 95. This provides external contact to computer 10 through connector 70 of I/0 board 67.

Thus, it will be apparent to one skilled in the art that there has been provided in accordance with the invention, a device that fully satisfies the objects, aims, and advantage set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

I claim:

1. A modular packaging structure for an electronic system, comprising:
   a central core means having a plurality of contact means around a periphery of the central core means; a plurality of semiconductor modules, each having integrated circuit devices mounted therein, and each semiconductor module being held by the central core means while simultaneously being provided with electrical contact thereto by the contact means; input/output means placed between the plurality of semiconductor modules for providing electrical contact to the central core means through the contact means, and wherein said central core means comprises:
   an insulated shaft;
   a plurality of contact rings disposed in a rotatable fashion on said shaft;
   a plurality of insulator rings disposed on said shaft adjacent said contact rings; and
   a plurality of contact arms coupled to said contact rings for connecting said semiconductor modules.

2. The modular packaging structure of claim 1 wherein each of said plurality of semiconductor modules comprises:
   a first semiconductor wafer having a front side and a back side;
   a plurality of contacts disposed on said back side of said first semiconductor wafers;
   pass through means disposed in said first semiconductor wafer for passing an electrical contact between said front and back sides of said first semiconductor wafer;
   said integrated circuit device being disposed in said first semiconductor wafer; and
   interconnect lines disposed on the front side of said first semiconductor wafer for coupling said integrated circuit device to said pass through means.

3. The modular packaging structure of claim 2 wherein said module further comprises:
   a second semiconductor wafer having a front side coupled to said front side of said first semiconductor wafer and a back side;
   a seal disposed about a periphery of said first and second semiconductor wafers;
   a plurality of contacts disposed on said back side of said second semiconductor wafer;
   pass through means disposed in said second semiconductor wafer for passing an electrical contact between said front and back sides of said second semiconductor wafer;
   an integrated circuit device being disposed in said second semiconductor wafer; and
   interconnect lines disposed on the front side of said second semiconductor wafer for coupling said electrical device to said pass through means.

4. The modular packaging structure of claim 3 wherein said pass through means comprises a pass through chip of semiconductor material.

5. The modular packaging structure of claim 1 wherein said central core means further comprises:
   a base coupled to said shaft;
   said contact rings defining a locking opening therethrough;
   a locking rod being insertably disposed in the locking opening of said insulator rings; and
   a top cap coupled to said locking rod.

6. A modular packaging structure for an electronic system, comprising:
   a central core means having a plurality of contact means around the periphery of the central core means; a plurality of semiconductor modules, each having integrated circuit devices mounted therein, and each semiconductor module being held by the central core means while simultaneously being provided with electrical contact thereto by the contact means; input/output means placed between the plurality of semiconductor modules for providing electrical contact to the central core means through the contact means, and wherein said central core means comprises:
   a base; and
   a plurality of connectors being coupled to said base in an adjacent relation, one of said semiconductor modules being disposed between a pair of said connectors; and wherein said plurality of connectors each comprise:
   a core;
   an elastomer strip disposed about said core;
   a plurality of electrical contacts disposed on the surface of said elastomer strip;
   a power bar being coupled to said core; and
   a ground bar being coupled to said core and electrically insulated from said power bar by said elastomer strip.

7. The modular packaging structure of claim 6 wherein said core is a comprised of foam:

8. A modular packaging structure for an electronic system, comprising:
   a central core means having a plurality of contact means around a periphery of the central core means; a plurality of semiconductor modules, each having integrated circuit devices mounted therein, and each semiconductor module being held by the central core means while simultaneously being provided with electrical contact thereto by the contact means; input/output means placed between the plurality of semiconductor modules for providing electrical contact to the central core means through the contact means, and wherein said input/output means comprises:
   a board having first and second surfaces;
   a plurality of contacts disposed on said first and second surfaces of said board;
   a connector coupled to an end of said board; and
   electrical lines coupling said plurality of contacts to said connector.

9. The modular packaging structure of claim 8 further including cooling means comprising,
   a plurality of inlet ducts having first ends and second ends, said inlet ducts being disposed adjacent said modules, said inlet ducts having a plurality of openings therein to direct an air flow toward said modules;
   a main duct being coupled to said second ends of said plurality of inlet ducts; and
   a fan to drive said stream of air through said main and inlet ducts.

10. An electronic modular packaging structure comprising:
    a first semiconductor wafer having a front side and a back side;
    a second semiconductor wafer having a back side and having a front side coupled to said front side of said first semiconductor wafer to form a module;
    a seal disposed about a periphery of said first and second semiconductor wafers;
    a plurality of contacts disposed on said back sides of said first and second semiconductor wafers;
    a plurality of pass through means disposed in said first and second semiconductor wafers for passing an electrical contact between said front and back sides of said first and second semiconductor wafers;
    a plurality of electrical devices being disposed in said first and second semiconductor wafers;
    interconnect lines disposed on the front sides of said first and second semiconductor wafers for coupling said electrical devices to said pass through said means;
    core means for retaining said module and providing an electrical bus;
    input/output means for providing electrical contact to said core;
    cooling means for removing heat from said module;
    housing means for housing said module, said core means, and said cooling means; and wherein said pass through means comprises a pass through chip of semiconductor material.

11. The modular packaging structure of claim 10 wherein said cooling means comprises:
    a plurality of inlet ducts having first ends and second ends, said inlet ducts being disposed adjacent said module, said inlet ducts defining a plurality of openings therein to direct an air flow toward said module;
    a main duct being coupled to said second ends of said plurality of inlet ducts; and
    a fan to drive said stream of air through said main and inlet ducts.

12. The modular packaging structure of claim 10 wherein said core means comprises:
    a shaft;
    a plurality of contact rings disposed on said shaft and defining a locking opening therethrough;
    a plurality of insulator rings disposed on said shaft adjacent said contact rings;
    a plurality of contact arms coupled to said contact rings for contacting said plurality of contacts disposed on said back sides of said first and second semiconductor wafers;
    a base coupled to said shaft;
    a locking rod being insertably disposed in the locking opening of said contact rings; and
    a top cap coupled to said locking rod.

13. The modular packaging structure of claim 10 wherein said core means comprises:
    a base; and
    a plurality of connectors being coupled to said base in an adjacent relation, said module being disposed between a pair of said connectors, each of said connectors comprising;
    a core;
    an elastomer strip disposed about said core;
    a plurality of electrical contacts disposed on the surface of said elastomer strip;
    a power bar being coupled to said core; and
    a ground bar being coupled to said core and electrically insulated from said power bar by said elastomer strip.

14. The modular packaging structure of claim 10 wherein said input/output means comprises:
    a board having first and second surfaces;
    a plurality of contacts disposed on said first and second surfaces of said board;
    a connector coupled to an end of said board; and
    electrical lines coupling said plurality of contacts to said connector.

15. A modular computer comprising:
    a first semiconductor wafer having a front side and a back side;
    a second semiconductor wafer having a front side coupled to said front side of said first semiconductor wafer and a back side:
    a seal disposed about a periphery of said first and second semiconductor wafers;
    a plurality of contacts disposed on said back side of said first and second semiconductor wafers;
    a plurality of pass through means disposed in said first and second semiconductor wafers for passing an electrical contact between said front and back sides of said second semiconductor wafer;
    an electrical device being disposed in said second semiconductor wafer;
    interconnect lines disposed on the front side of said second semiconductor wafer for coupling said electrical device to said pass through means;
    a shaft;
    a plurality of contact rings disposed on said shaft and defining a locking opening therethrough;
    a plurality of insulator rings disposed on said shaft adjacent said contact rings;

a plurality of contact arms coupled to said contact rings for contacting said plurality of contacts disposed on said back sides of said first and second semiconductor wafers;

a base coupled to said shaft;

a top cap coupled to said base;

input/output means for providing electrical contact to said core;

cooling means for removing heat from said module; and housing means for housing said module and core means 16. The modular computer of claim 15 wherein said input/output means comprises:

a board having first and second surfaces;

a plurality of contacts disposed on said first and second surfaces of said board;

a connector coupled to an end of said board; and electrical lines coupling said plurality of contacts to said connector.

17. The modular computer of claim 15 wherein said cooling means comprises:

a plurality of inlet ducts having first ends and second ends, said inlet ducts being disposed adjacent said module, said inlet ducts defining a plurality of openings therein to direct an air flow toward said module;

a main duct being coupled to said second ends of said plurality of inlet ducts; and a fan to drive said stream of air through said main and inlet ducts.

* * * * *